(12) United States Patent
Fryer et al.

(10) Patent No.: US 6,194,957 B1
(45) Date of Patent: Feb. 27, 2001

(54) CURRENT MIRROR FOR PREVENTING AN EXTREME VOLTAGE AND LOCK-UP

(75) Inventors: Martin A. Fryer, Swindon; Dominic Charles Royce, Wokingham, both of (GB)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/416,464

(22) Filed: Oct. 12, 1999

(30) Foreign Application Priority Data

Oct. 15, 1998 (EP) .................................................. 98308428

(51) Int. Cl.$^7$ ....................................................... G05F 3/26
(52) U.S. Cl. ........................... 327/543; 327/538; 323/316
(58) Field of Search ..................... 327/538, 540, 327/541, 543, 539; 323/313, 315, 316

(56) References Cited

U.S. PATENT DOCUMENTS

| | | | |
|---|---|---|---|
| 5,412,348 | * 5/1995 | Kasha et al. | 330/288 |
| 5,867,012 | * 2/1999 | Tuthill | 323/316 |
| 6,075,407 | * 6/2000 | Doyle | 327/541 |
| 6,091,287 | * 7/2000 | Salter et al. | 327/543 |
| 6,107,789 | * 8/2000 | Fryer et al. | 323/316 |

FOREIGN PATENT DOCUMENTS

| | | | |
|---|---|---|---|
| 0 403 195 A1 | 6/1990 | (EP) | G05F/3/26 |
| 0 647 894 A2 | 10/1994 | (EP) | G05F/3/26 |
| 0 715 239 A1 | 11/1994 | (EP) | G05F/3/26 |

* cited by examiner

*Primary Examiner*—Timothy P. Callahan
*Assistant Examiner*—Terry L. Englund

(57) ABSTRACT

A current mirror comprises reference and output devices (21, 22), and an amplifier (23) for sensing the drain voltages of said devices (21, 22) and applying a control signal to their gates via a normally-closed switch (33). The output current of a circuit (not shown) feeding the reference device (21) may change if the voltage across it becomes too small. The amplifier (23) attempts to force almost identical voltages on the output electrodes of the reference and output devices. If the output voltage (at OUT) of the current mirror approaches an extreme of the output voltage range, the current feeding the reference device may change, and the output current will be incorrect. Also, if at start up the output voltage approaches this extreme, the circuit may "lock up". Comparator 31, in response to the output voltage reaching a predetermined level, opens switch (33) and closes a normally-open switch (32), whereby the circuit reverts to the normal diode-connected mode, keeping the drain of the reference device (21) at a suitable voltage.

3 Claims, 1 Drawing Sheet

CURRENT MIRROR FOR PREVENTING AN EXTREME VOLTAGE AND LOCK-UP

CROSS-REFERENCE TO RELATED APPLICATION

This application claims priority of European Patent Application No. 98308428.6, which was filed on Oct. 15, 1998.

BACKGROUND OF THE INVENTION

1. Field of the Invention

This invention relates to current mirrors.

2. Description of the Related Art

A conventional current mirror has an input or reference device, which is usually diode-connected, and an output device. For increased accuracy the diode connection may be replaced by an amplifier which senses the voltages on the output electrodes of the reference and output devices and provides an output to the control electrodes of the devices. Under some circumstances the output current may be incorrect because the circuit that feeds the reference device is usually imperfect. The output current of such a circuit may change if the voltage across it becomes too small. The amplifier attempts to force almost identical voltages on the output electrodes of the reference and output devices. If the output voltage of the current mirror approaches an extreme of the output voltage range, the current feeding the reference device may change substantially, and the output current will be incorrect. Furthermore, if at start-up the output voltage approaches the said extreme, the amplifier may force the output electrode of the reference device to a similar voltage, and the circuit may "lock-up" in this undesired state with no current flow.

SUMMARY OF THE INVENTION

According to this invention a current mirror comprises a reference device, an output device, each said device having first and second controlled electrodes and a control electrode, the control electrodes of the devices being connected together, an amplifier having an input connected to the first controlled terminal of the reference device and another input connected to the first controlled electrode of the output device, means for connecting output from the amplifier to the control electrodes of the devices, and means for connecting the first controlled and control electrodes of the reference device together in response to the voltage at the first controlled electrode of the output device exceeding a predetermined level.

The connecting means may comprise a comparator having an input connected to the first controlled electrode of the output device and another input for receiving a reference voltage, and a switch for connecting the first controlled and control electrodes of the reference device together in response to a predetermined output from the comparator. The means for connecting the amplifier output to the control electrodes of the devices may comprise a switch which opens in response to the predetermined output of the comparator.

DETAILED DESCRIPTION

Figure 1:
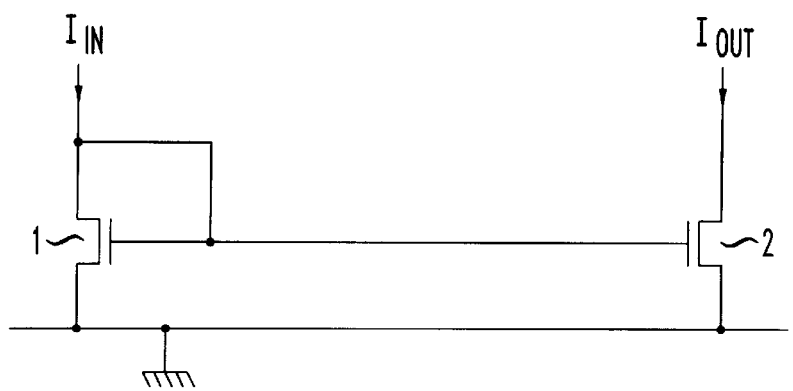
FIG. 1 is a simplified circuit diagram of a known current mirror.

Referring now to FIG. 1, a simple current mirror comprises a reference device 1 (sometimes termed an input or logging device), and an output device 2. The devices shown are of the NMOS type, although it will be appreciated that other devices such as PMOS or bipolar devices may be employed. The drain of device 1 is connected to the gates of devices 1 and 2. The sources of devices 1 and 2 are connected to, in this case, ground. As will be appreciated, device 1 is diode-connected. The operation of such a current mirror is well known and will not be described.

Figure 2:
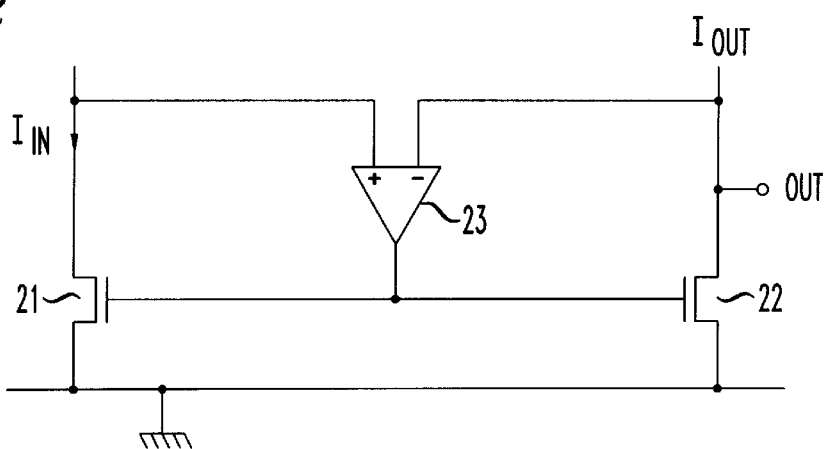
FIG. 2 is a circuit diagram of an amplifier current mirror.

Referring now to FIG. 2, a current mirror having increased accuracy comprises a reference device 21, an output device 22, and an amplifier 23. Although devices 21 and 22 are shown as of the NMOS type, other devices may be used, such as PMOS or bipolar types. The sources of devices 21 and 22 are connected to, in this case, ground, and their gates are connected together. The drain of device 21 is connected to one input of amplifier 23. The drain of device 22 is connected to an output terminal OUT and to another input of amplifier 23. In operation amplifier 23 senses the drain voltages of devices 21 and 22 and provides a control voltage to the gates of devices 21 and 22.

As noted earlier, the circuit (not shown) feeding the reference device 21 is usually imperfect, and its output current will tend to change if the voltage across it becomes too small. Amplifier 23 attempts to force almost identical voltages on the drains of devices 21 and 22. However, if the output voltage exceeds a predetermined threshold level, i.e., in this case if the output voltage becomes close to the opposite supply voltage (opposite to the voltage on the sources of the reference and output devices) then the current feeding the reference device 21 may change substantially, and the output current will be incorrect. In addition, if at start-up of the circuit the output voltage at OUT exceeds the predetermined level, again, in this case, if it becomes close to the opposite supply voltage, the amplifier 23 may force the drain of the reference device 21 to a similar voltage, and the circuit may "lock-up" in this undesired state.

Figure 3:
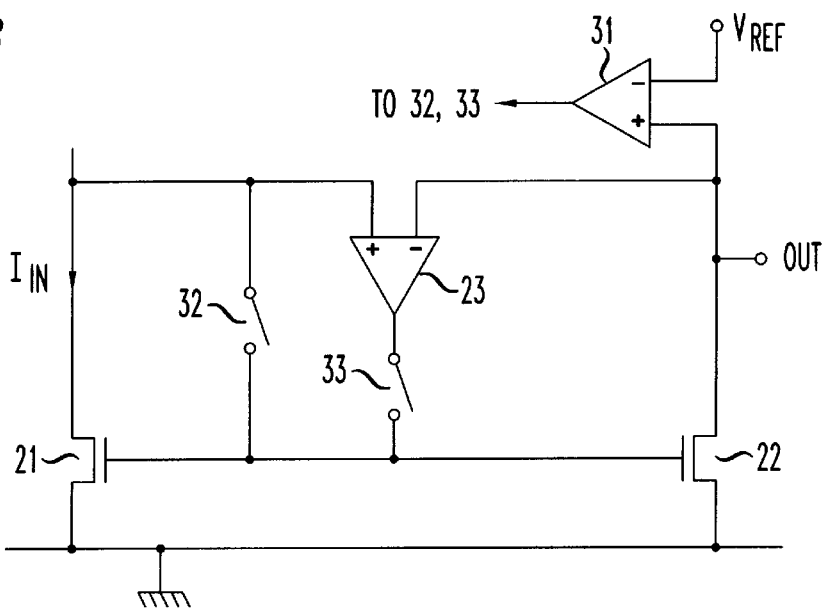
FIG. 3 is a circuit diagram of a current mirror embodying the invention.

Referring now to FIG. 3, an exemplary current mirror embodying the invention comprises the current mirror of FIG. 2 with additional components, namely a comparator 31 and switches 32 and 33. In FIGS. 2 and 3, like references denote like parts. The drain of device 22 is connected to one input of comparator 31, the other input of which is connected to a voltage reference source $V_{ref}$. The drain of device 21 is connected to one side of a switch 32, the other side of which is connected to the gates of devices 21 and 22. The output of amplifier 23 is connected via switch 33 to the gates of devices 21 and 22. Switches 32 and 33 are controlled by the output of comparator 31. In normal operation, switch 32 is open, switch 33 is closed, and operation of the current mirror is as previously described with reference to FIG. 2.

In response, however, to the output voltage at OUT exceeding the predetermined threshold level referred to above, comparator 31 changes state, and closes normally-open switch 32 and opens normally-closed switch 33, and the circuit reverts, in effect, to a diode-connected mode. In this mode the drain of the reference device 21 is kept at a suitable voltage. Although the output current will not now be so accurate, the inaccuracy occurs at an extreme of the output voltage range. It also overcomes the start-up problem noted above.

As described, the predetermined level at which comparator 31 changes state is set at or near the opposite supply voltage because, for the exemplary circuit described, the current feeding the reference device 21 may change substantially, or "lock-up" may occur at start-up of the circuit, when the output voltage becomes close to the opposite supply voltage. As will be appreciated, however, the predetermined level at which comparator 31 changes state may alternatively be selected to correspond to any output voltage at which either or both of these undesirable effects occurs.

Switch 33 may be omitted if the output current capacity of amplifier 23 is substantially weaker than the current $I_{in}$ in the reference device 21.

Comparator 31 and switches 32 and 33 may take a variety of forms, as will be appreciated by those skilled in the art, and details thereof will not be described further.

What is claimed is:

1. A current mirror comprising a reference device, an output device, each said device having first and second controlled electrodes and a control electrode, the control electrodes of the devices being connected together, an amplifier having an input connected to the first controlled terminal of the reference device and another input connected to the first controlled electrode of the output device, first means for connecting an output from the amplifier to the control electrodes of the devices, and second means for connecting the first controlled and control electrodes of the reference device together in response to a voltage at the first controlled electrode of the output device exceeding a predetermined level.

2. A current mirror as claimed in claim 1 wherein the second connecting means comprises a comparator having an input connected to the first controlled electrode of the output device and another input for receiving a reference voltage, and a switch for connecting the first controlled and control electrodes of the reference device together in response to a predetermined output from the comparator.

3. A current mirror as claimed in claim 2 wherein the first means for connecting the amplifier output to the control electrodes of the devices comprises another switch which opens in response to the predetermined output of the comparator.

* * * * *